United States Patent [19]

Gleim

[11] Patent Number: 5,453,922
[45] Date of Patent: Sep. 26, 1995

[54] GENERATOR FOR AMPLITUDE-COUPLED VOLTAGES

[75] Inventor: Günter Gleim, Villingen-Schwenningen, Germany

[73] Assignee: Deutsche Thomson-Brandt GmbH, Villingen-Schwenningen, Germany

[21] Appl. No.: 336,810

[22] Filed: Nov. 9, 1994

Related U.S. Application Data

[63] Continuation of Ser. No. 46,969, filed as PCT/EP91/01567, Aug. 19, 1991, abandoned.

[30] Foreign Application Priority Data

Aug. 25, 1990 [DE] Germany ............................ 40 26 987.6
Sep. 17, 1990 [DE] Germany ............................ 40 29 409.9

[51] Int. Cl.⁶ .............................. H02M 7/00; H02K 23/00
[52] U.S. Cl. ................................ 363/49; 318/254
[58] Field of Search ............................... 363/49, 59, 78, 363/104; 323/238, 256; 318/138, 254, 738, 778

[56] References Cited

U.S. PATENT DOCUMENTS

| | | | |
|---|---|---|---|
| 4,899,093 | 2/1990 | Gleim | 318/254 |
| 5,041,956 | 8/1991 | Marinus | 363/49 |
| 5,233,276 | 8/1993 | Gleim | 318/368 |
| 5,254,878 | 10/1993 | Olsen | 307/75 |

FOREIGN PATENT DOCUMENTS

| | | | |
|---|---|---|---|
| 0339381 | 4/1989 | European Pat. Off. | H02M/7/54 |
| 1554923 | 1/1968 | France | H02M/7/54 |
| 871025 | 7/1949 | Germany . | |
| 2416266 | 4/1974 | Germany | H02K/29/02 |
| 2513758 | 10/1975 | Germany | H02P/1/04 |

OTHER PUBLICATIONS

Patent Abstracts of Japan, vol. 9, No. 89, (E-309)(1812), Apr. 18, 1985.

*Primary Examiner*—Steven L. Stephan
*Assistant Examiner*—Matthew V. Nguyen
*Attorney, Agent, or Firm*—Joseph S. Tripoli; Eric P. Herrmann; Daniel E. Sragow

[57] ABSTRACT

A method for generating amplitude-coupled voltages for driving a multiple-winding electric motor using tapped voltages which correspond to the values of at least one predetermined curve configuration and using amplitude-coupled output voltages having a progression determined by time-controlled switching of the tapped voltages according to at least one temporal function includes an improvement wherein the tapped voltages have a progression, and the tapped voltages are controlled in such a way that the motor receives voltages having a first curve configuration during a start-up phase and voltages having a second curve configuration during normal operation.

8 Claims, 4 Drawing Sheets

GENERATOR FOR AMPLITUDE-COUPLED VOLTAGES

This is a continuation of PCT application PCT/EP 91/01567 filed Aug. 19, 1991 by Gunter Gleim and titled "Generator For Amplitude-Coupled Voltages" and also a continuation of U.S. application Ser. No. 08/046,969 filed Apr. 14, 1993, now abandoned.

BACKGROUND OF THE INVENTION

The invention is directed to a system facility for generating amplitude-coupled voltages. The: term "amplitude-coupled" is to be understood in this context as meaning that a common alteration of the peak values of the electric voltages is effected by a single trigger signal. It is generally known that, for various applications, electric voltages with a present temporal curve which are amplitude-coupled must be present. Therefore, for triggering multiple-winding motors, for example, several amplitude- and phase-related voltages are required with curves which should be of the greatest possible sine-wave shape.

A circuit arrangement for generating phase-shifted, sine-wave form voltages is described in DE-OS 38 14 562. The system described therein uses a network of resistors which are wired in series in a closed circle, voltages in sine-wave form can be picked up at the connection points where the resistors are wired together. In this, a direct voltage in cyclic sequence is fed to the resistor network in such a way that two parallel branches with the same number of resistors are located between the poles of the direct voltage. This system can only approximate a voltage curve with a sine-wave form.

In some applications it is desirable to supply several amplitude-coupled voltages which satisfy the preset temporal curves but are not compulsorily phase-coupled.

SUMMARY OF THE INVENTION

Therefore, it is an object of the invention, to generate amplitude-coupled voltages which follow, as accurately as possible, one or more preset temporal curves. The principle of the invention is that a tapping circuit provides tapped voltages, the values of which can be altered, in an additive or multiplicative way, by a single trigger signal and which correspond to one or more predetermined curves. Through a temporal matched change-over between these tapped voltages, amplitude-coupled output voltages $U_{a1} \ldots U_{ax}$ are generated which at least correspond to a preset temporal curve $f(t)$; i.e.

$$U_{a1} = U \times f_1 (t + d_1)$$
$$U_{a2} = U \times f_2 (t + d_2)$$
$$\vdots$$
$$U_{ax} = U \times f_x (t + d_x).$$

A further advantage of the invention is that at least some of the output voltages $U_{a1} \ldots U_{ax}$ can be phase related and that particular output voltages follow a curve which progresses in the same way as the remaining output voltages but with a different temporal curve.

When the tapping circuit contains a network of components to which a total voltage can be connected and through which tapped voltages originate at the components, then a simple and stable version is produced. When the preset temporal curve corresponds to a trigonometric function, then the invention preferably serves for triggering motors with multiple windings. The control of the time function by a time function element serves to generate output voltages which are especially accurate with regard to time. This is particularly interesting if the invention is employed for measuring purposes.

Controlling the preset temporal function using a sensor which detects the effect of the output voltages on an electric apparatus, for example a motor, has a special advantage that the triggering is optimum even with a different number of revolutions of a motor. When the sensor and the time function element together serve to control the time function, then, in addition to control, temporal interpolation between measured values can possibly be based on measured values. When the tapping circuit is triggered by an electronic control device in such a way that the tapped voltages correspond to the preset values, the special advantage that any curve for the output voltages can be predetermined is realized.

When using an input contrivance, via which the temporal curve of the output voltages can be preset, then the facility according to the invention can be universally employed in various application fields.

If additional means of attenuation and/or amplification are incorporated, which can attenuate or amplify the tapped voltages, then the facility according to the invention also allows that the amplitude curve of the at least one output voltage can also be varied.

Besides the better matching to a preset temporal curve, one embodiment of the invention also permits that several temporal curves with their peak values can be predetermined which follow the amplitude-coupled output voltages.

If one or more of the output voltages at various times correspond to various curves and/or temporal curves, then this has the advantage, among other things, that the output voltages can be optimized during speed-up or slow-down phases of an electric consumer.

Therefore, a first curve can be used for the start or speed-up and a second curve for the normal operation of an electric motor with one or more windings. Such triggering can be carried out by the facility according to the invention or by other suitable means. Distinguishing between the speed-up phase and normal operation can, for example, be achieved by means of a threshold r.p.m., a threshold load value and/or other values which represent variables so that the direction of rotation of the motor corresponds to the desired direction of rotation and/or the necessary quietness (smoothness) of running is present.

DESCRIPTION OF THE DRAWING

Preferred embodiment examples of the invention are illustrated in the drawing and more closely described in the following.

The figures show.

Before the description of the embodiment examples is explained any further it should be pointed out that the blocks illustrated individually in the figures merely serve for the better understanding of the invention. Normally, single or several of these blocks are combined to form units. This can be realized in integrated or hybrid technology or, however, as a program-controlled microcomputer or as a part of a program suitable for its control.

Furthermore, it should also be pointed out that the individual steps contained in the facility and elements can also be accomplished separately.

DETAILED DESCRIPTION

Figure 1:
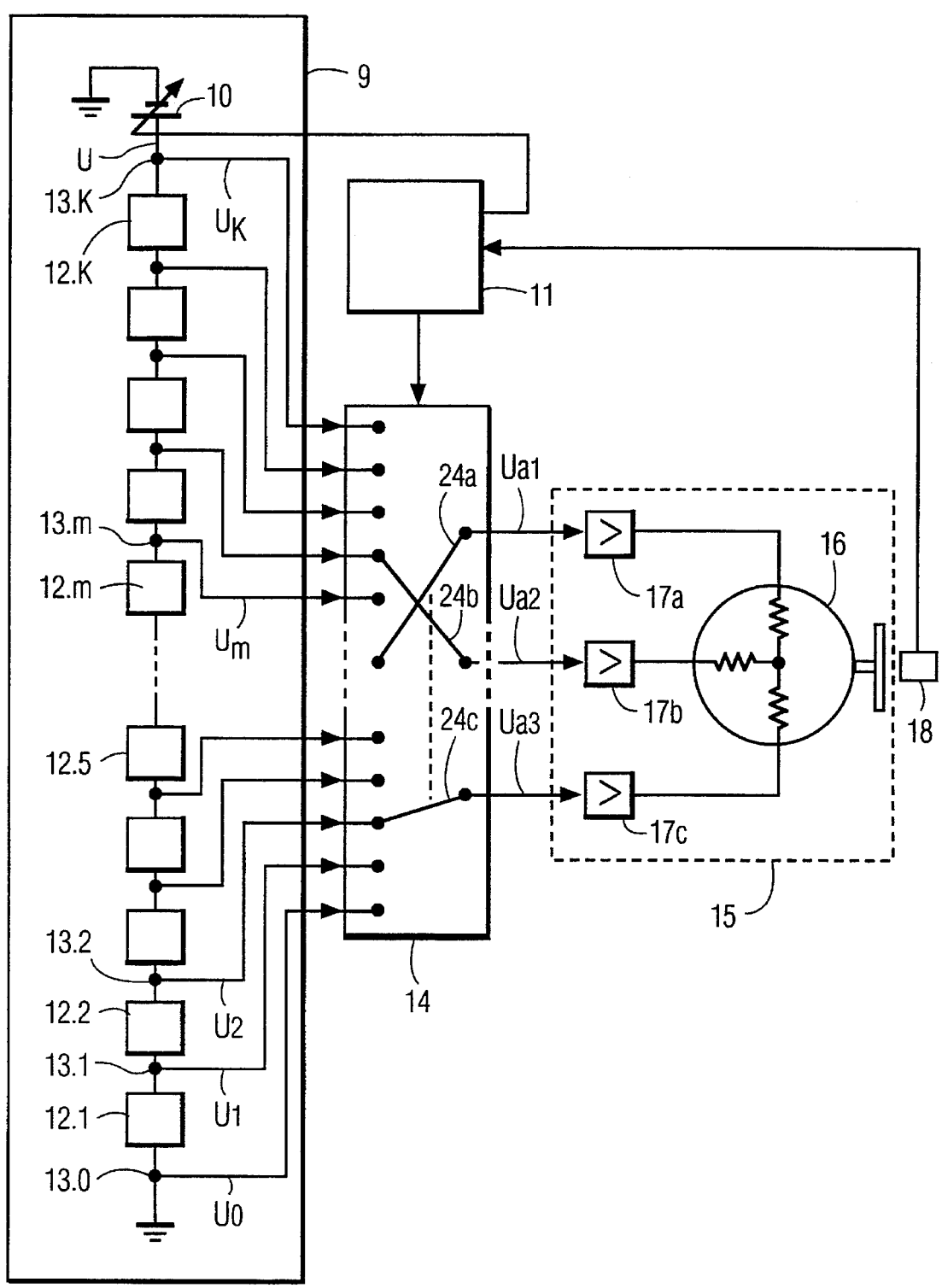
FIG. 1 is a first embodiment for triggering a motor with three windings.

A tapping contrivance 9 is shown in FIG. 1 which has a controllable voltage source 10, which provides an output voltage U depending on the control impulses of an electronic control device 11, and a network which is formed from components 12.1 . . . 12.k. This results in the tapping (withdrawal) points 13.0... 13.k with lines leading from these points to a switching apparatus 14 which incorporates change-over switches 24a, 24b, 24c, receives impulses from the electric control device and provides output voltages for an electric consumer 15.

As an electric consumer, a motor 16 with three windings is illustrated in FIG. 1, whereby each winding is allocated a corresponding amplifier stage 17a, 17b, 17c. Situated at the electronic consumer 15 is a sensor 18 which detects the operating variables of the consumer 15, like for example, position and/or r.p.m., and sends out signals to the electronic control device 11.

Figure 2:
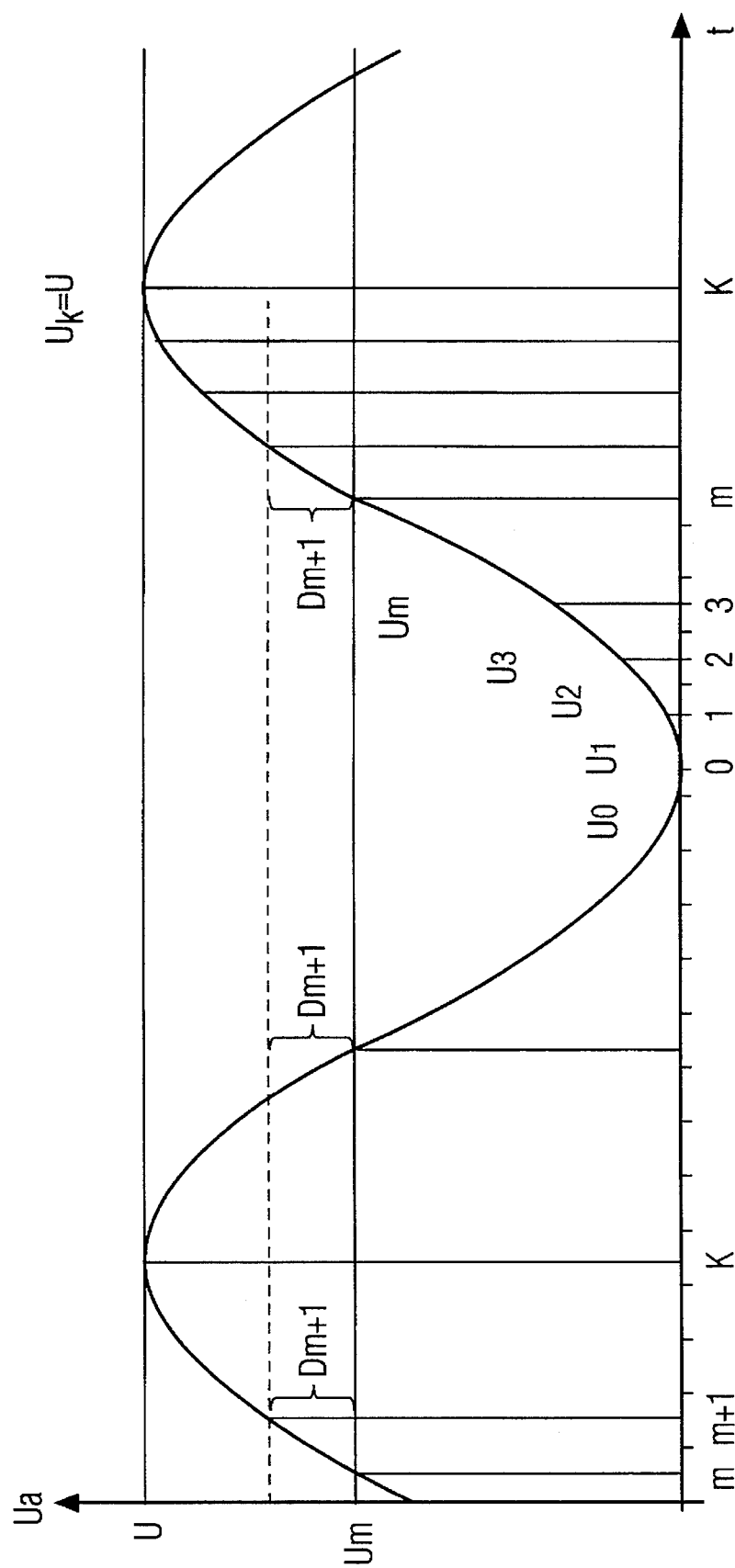
FIG. 2 shows a preset temporal curve with values of tapped and individual voltages according to the embodiment example given in FIG. 1.

The purpose of the embodiment example for the facility according to the invention as shown in FIG. 1 IS explained in FIG. 2. Here, an output voltage Ua with a sine-wave curve is illustrated, whereby the curve is so shifted that negative values are avoided. Thus, $UA=\frac{1}{2}(U+U \times \sin(t))$. The progression of the curve in FIG. 2 is, therefore, firstly determined by the peak value U and further, by the temporal function sin(t).

The voltage U is adjusted at the voltage source 10 by means of the electronic control device 11. The temporal progression of the sinusoidal curve is realized in that the course of the curve is divided into individual sections. Therefore, it can be seen in FIG. 2 that, for example, at point 0 the abscissa is a minimum of the curve sin(t) and at point K a maximum corresponding to the voltage U. The curve between the minimum and the maximum is divided into significant points 1, 2, 4, . . . k at which the tapped voltages U1, U2, U3, . . . Uk result. The following is true for an arbitrary tapped voltage Um+1:

$Um+1=Um+Dm+$.

Therefore, the components 12.1 . . . 12.k in the circuit according to FIG. 1 are sized such that the preset voltages D, corresponding to D1 . . . Dk, drop at these. Thereby, the tapped voltages U0 . . . Uk ensue as total voltages at the tapping points 13.0 . . . 13.k.

The switching apparatus 14 switches between the individual tapping points 13, corresponding to 13.0 . . . 13.k, in such a way that a sine-wave output signal Ua is available at each of their outputs.

If, for example, the output associated with change-over switch 24a supplies a sine-wave output signal Ua1 with, at first, climbing values, then it is switched by the electronic control device 11 such that it is firstly switched from an arbitrary input terminal (corresponding to the tapping point 13.m) in the direction of the higher voltage values (corresponding to the tapping points 13.m+1, 13.m+2. . . 13.k), subsequently to the lower voltage values, then again to the higher values, etc.

This process proceeds in a similar fashion for the change-over switches 24b and 24c. If the output voltages Ua1, Ua2, Ua3 supplied through the change-over switches 24a, 24b, 24c are to be phase-coupled, then a fixed coupling must exist between the change-over switches 24. This can be performed either by control signals from the electronic control device 11 or by some resource, not shown in FIG. 1, of the switching apparatus 14.

The output voltages Ua1, Ua2, Ua3 supplied from the change-over switches 24a, 24b, 24c are transmitted to the electronic consumer 15. In the embodiment example according to FIG. 1 is a motor 16 with three windings, whereby each winding is allocated an amplifier stage 17a, 17b, 17c. The output voltages must then have a phase shift of 120 degrees. The motor 16 is driven by the boosted power from the amplifier stages 17a, 17b, 17c. The r.p.m. and/or the position of the motor 16 is detected by the sensor 18 which can be built, for example, as a tachometer generator. The signals supplied by the sensor 18 are transmitted to the electronic control device 11 which, thereupon, triggers the switching apparatus 14 using control pulses relating to the commutation, and the voltage source 10 using control pulses relating to torque or r.p.m.

In a variation of the embodiment example according to FIG. 1, it is possible that besides the components 12.1 . . . 12.k wired in series, further components, which are not illustrated, are provided wired in parallel with the aforementioned elements. Thereby, it can be achieved that the tapped voltages U0 . . . Uk are better matched to the desired curve, in this case the sinusoid.

Figure 3:
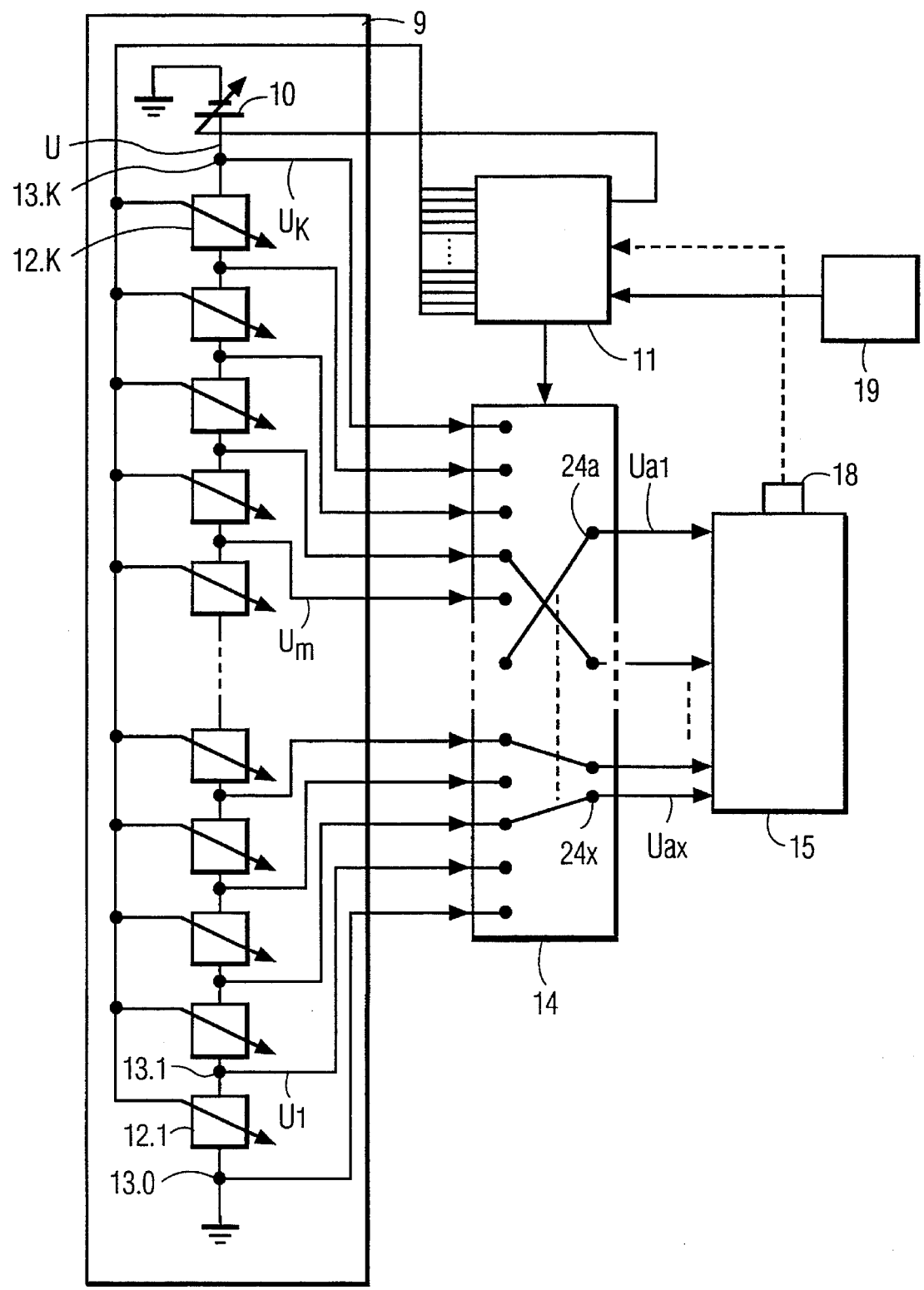
FIG. 3 is a second embodiment with adjustable components.

A second embodiment example is shown in FIG. 3. Here, means and components are indicated with identical reference numbers as those which have similar functions in the embodiment example according to FIG. 1. These will only be mentioned in the following insofar as is significant for the understanding of the present invention.

Fundamental to the embodiment example according to FIG. 3 is that an input facility 19 is provided which transmits impulses to the electronic control device 11. Furthermore, the electrical properties of components 12.1 . . . 12.k can be altered, like for example, resistor and capacitor, by control impulses which are supplied from the electronic control device 11.

This has the effect that the individual voltages D dropping at the respective components 12 can be altered. As the tapped voltages U1 . . . Uk result from the individual voltages D it is possible, therefore, to enable values for a desired temporal curve of the output voltages to be predetermined via the input facility 19. The value of the voltage U can also be preset via the input facility 19. In addition, it is indicated in the embodiment example according to FIG. 3 that the switching apparatus 14 can contain more than three change-over switches so that several output voltages Ua1 . . . Uax can also be generated.

Alternatively, the embodiment example can also be arranged such that the electronic control device 11 controls its output impulses to the tapping stage 9 independently of signals from sensor 18 and/or through signals from a time function element which is not illustrated.

Furthermore, it can be considered that, in the tapping stage 9, a further voltage source be provided and/or that a least some of the components 12.1 . . . 12.k are built as voltage sources. Therewith, it is achieved that the tapped voltages U1 . .. Uk can also represent an asymmetric curve.

In another variation, which refers not only to the embodiment example according to FIG. 1 but also to that in accordance with FIG. 3, it can be further considered that the tapped voltages represent values of various curves. This can be realized such that U0, U2 . . . correspond to a first curve and U1, U3 . . . correspond to a second curve. Further, a subdivision into U0 . . .Um for curve 1 and Um+1. .. Uk for curve 2 can be considered. If more than two curves are to be realized, then corresponding partitioning is valid.

Furthermore, it can be considered that the output voltages Ua0 . . . Uax are in fact amplitude-coupled, i.e., a common alteration to the peak values of the individual output voltages is achieved by a single trigger signal but that they do not have an identical peak value. This can be realized by amplification elements or attenuators which are not shown and which, for example, can form part of the switching apparatus 14 and can also be triggered by the electronic control device 11.

In a further variation, it is additionally possible that one or several of the output voltages correspond to various times of various curves and/or temporal curves.

This can be utilized to advantage in the triggering of motors with one or more windings, whereby a discrimination is made between the start-up and normal operation.

Figure 4:
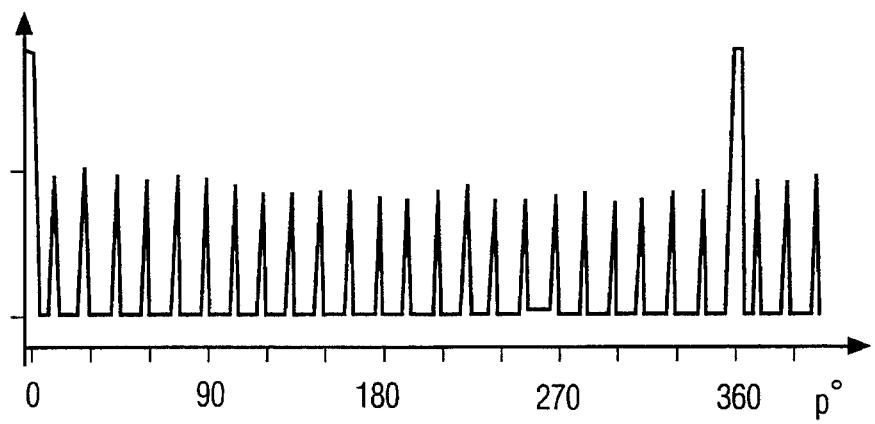
FIG. 4 shows output signals of a sensor for detecting the r.p.m. and/or position of the motor.

In the following it is assumed that the motor 16 is triggered by the output voltages Ua1, Ua2, Ua3 and that its r.p.m. and/or position is detected by the sensor 18. This sends an output signal as is shown in FIG. 4 as a function of the position p.

When the motor 16 is in its starting position, i.e., p=0 degrees, a certain mark is fixed which leads to a signal which differs from the other output pulses. In addition, the marks on a rotor or a rotor disk are fixed such that an appropriate output signal ensues from the sensor 18 for every 15 degrees of the motor position.

Figure 5:
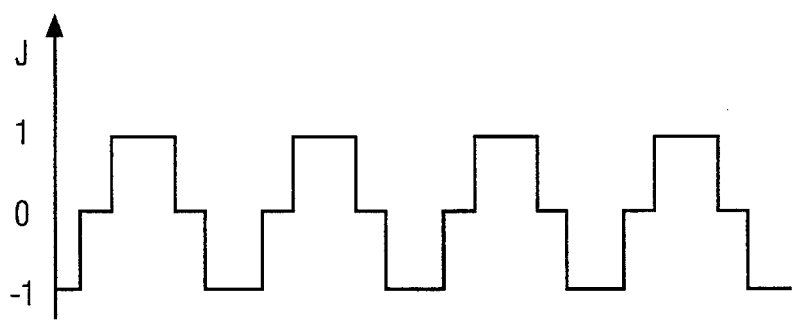
FIG. 5 shows a motor trigger signal with a first curve for the start phase.

Depending on these output signals from sensor 18, the electronic control device 11, at measured rotational speeds n, can send out signals with a first curve according to FIG. 5 by means of the individual amplifier stages 17 for the windings of a motor 10.

Figure 6:
FIG. 6 shows voltages resulting from a triggering according to FIG. 5.

The steep transition between amplitude values −1, 0 and +1 of the trigger signal according to FIG. 5 leads to a voltage curve according to FIG. 6. It is plain to see that various interference peaks a, b, c, d appear. While, in this example, the interference peaks c, d are crosstalk peaks caused by trigger signals of other motor windings, the interference peaks a, b caused by the winding concerned can influence other signals in an apparatus, for example, a video recorder, in which the motor 16 and the resources shown are arranged for its control.

Figure 7:
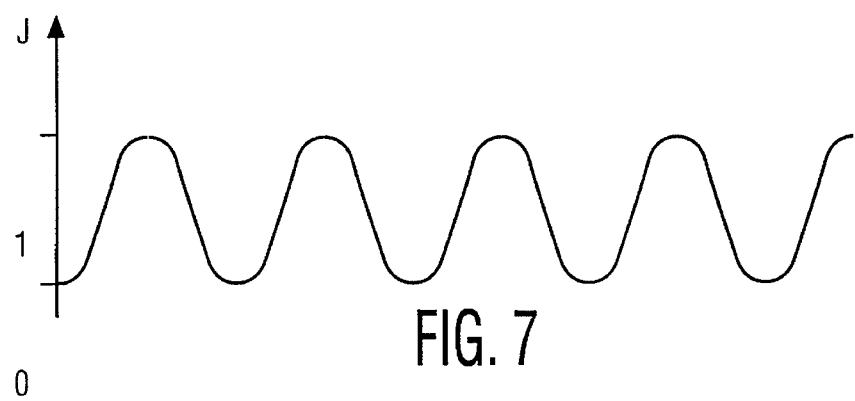
FIG. 7 shows a motor trigger signal with a second curve for the normal operation.

A trigger signal with a preferred second curve is illustrated in FIG. 7.

With the preferred embodiment example, the signal of FIG. 7 is in phase with the signal of FIG. 5 with respect to the position of the motor 16. This means that extreme values or zero crossings to an identical position p, i.e. angular position of a rotor for the motor 16, occur.

Such a second curve, which with regard to the first curve has a rounded course, can occur through a suitable triggering of the voltage source 10 and/or the switching apparatus 14.

Furthermore, it is conceivable that the output signals Ua or the signals processed by the amplifier 17 are rounded off by a rounding facility which is not illustrated. This contains, for example, analog stages with suitable RC modules or digital stages with a suitable counter which counts an oscillator frequency, the frequency of which is greater than the maximum speed of the scanning pulse but, however, slower than the probable interference peaks.

Thereby, for example, trigger signals can be achieved which have an almost sine-wave course.

Therefore, on the whole, a facility for generating amplitude-coupled voltages with preset temporal curves is presented which has a tapping stage with, preferably, a network of components at which individual voltages drop and, consequently, tapped voltages are prepared which at least represent a preset curve.

The temporal curve is determined by control signals from an electronic control device whereby change-over switches switch the tapped voltages such that the preset output voltages are available. These can be phase-coupled or have curve shapes with various temporal courses and can be realized through the electronic control device and/or through means which are not illustrated.

The facility according to the invention has a particular advantage in that a common alteration to the peak values of the output voltages supplied is determined by a single trigger signal from the electronic control device. Thereby, when digital components are used, only a digital-analog converter, which can be a part of the control device 11 or the voltage source 10, is necessary for common triggering of the output voltages.

One arrangement of the facility according to the invention allows the generation of amplitude-coupled output voltages according to curve progressions which are preset from an external source.

If curves of the output voltages are controlled by means of signals from sensors detecting the operating variables of an item which is to be triggered, then an improved triggering of this item can be achieved.

If the item to be triggered is an electric motor, then various output voltage curves can be independently realized regardless of whether a start-up phase or normal mode is present.

I claim:

1. Apparatus for generating amplitude-coupled voltages for driving a multiple-widing electric motor, said amplitude-coupled voltages having predetermined curve shapes, comprising means for generating tapped voltages which correspond to values of at least one of said predetermined curve shapes, and for generating amplitude-coupled output voltages having a progression determined by time-controlled switching of said tapped voltages according to at least one temporal function, and means for controlling said tapped voltages in such a way that said motor receives voltages having a first curve shape during a start-up phase and voltages having a second curve shape during normal operation.

2. Apparatus according to claim 1 comprising means for rounding off the amplitude-coupled output voltages.

3. Apparatus according to claim 1 comprising means for controlling the progression of the amplitude-coupled output voltages as a function of time or as a function of an operating variable of the motor.

4. Apparatus according to claim 1 comprising means for externally controlling the progression of the amplitude-coupled output voltages.

5. Facility for generating amplitude-coupled voltages having predetermined curve shapes for a triggering of a multiple-winding electric motor comprising a tapping contrivance providing tapped voltages which correspond to values of at least one of said predetermined curve shapes, a switching apparatus which switches the tapped voltages according to at least one time function in such a way that amplitude-coupled output voltages with at least one temporal progression are present, and control means for triggering the tapping contrivance or the switching apparatus in such a way that the motor is fed with output signals with a first curve shape during a start-up phase and output signals with a second curve shaped during normal operation.

6. Facility for generating amplitude-coupled voltages having predetermined curve shapes for a triggering of a multiple-winding electric motor, comprising a tapping contrivance providing tapped voltages which correspond to values of at least one of said predetermined curve shapes, a switching apparatus which switches the tapped voltages according to at least one time function in such a way that amplitude-coupled output voltages with at least one temporal progression are present, control means for triggering the tapping contrivance or the switching apparatus in such a way that the motor is fed with output signals with a first curve shape during a start-up phase and output signals with a second curve shape during normal operation, and means switchable by said control means for rounding-off the output signals.

7. Facility for generating amplitude-coupled voltages having predetermined curve shapes for a triggering of a multiple-winding electric motor, comprising a tapping contrivance providing tapped voltages which correspond to values of at least one of said predetermined curve shapes, a switching apparatus which switches the tapped voltages according to at least one time function in such a way that amplitude-coupled output voltages with at least one temporal progression are present, control means for triggering the tapping contrivance or the switching apparatus in such a way that the motor is fed with output signals with a first curve shape during a start-up phase and output signals with a second curve shape during normal operation, and a sensor means for detecting a rotational speed or position of the motor and for controlling the progression of the output signals as a function of time or as a function of rotational speed or position of the motor.

8. Facility for generating amplitude-coupled voltages having predetermined curve shapes for a triggering of a multiple-winding electric motor comprising a tapping contrivance providing tapped voltages which correspond to the values of at least one of said predetermined curve shapes, a switching apparatus which switches the tapped voltages according to at least one time function in such a way that amplitude-coupled output voltages with at least one temporal progression are present, control means for triggering the tapping contrivance or the switching apparatus in such a way that the motor is fed with output signals with a first curve shape during a start-up phase and output signals with a second curve shape during normal operation, and input means for predetermining the tapped voltages or the temporal progression of the amplitude-coupled output voltages.

* * * * *